United States Patent [19]
Yakuwa

[11] Patent Number: 6,060,959
[45] Date of Patent: May 9, 2000

[54] SMALL TRANSDUCER CONNECTED BETWEEN STRIP LINE AND WAVEGUIDE TUBE AND AVAILABLE FOR HYBRID INTEGRATED CIRCUIT

[75] Inventor: Naoki Yakuwa, Tokyo, Japan

[73] Assignee: NEC Corporation, Japan

[21] Appl. No.: 09/116,349

[22] Filed: Jul. 16, 1998

[30] Foreign Application Priority Data

Jul. 16, 1997 [JP] Japan .................................. 9-190332

[51] Int. Cl.[7] .................................................. H01P 5/107
[52] U.S. Cl. ............................................. 333/26; 333/33
[58] Field of Search .................................... 333/21 R, 33, 333/26; 343/859, 862

[56] References Cited

U.S. PATENT DOCUMENTS

| | | | |
|---|---|---|---|
| 4,716,386 | 12/1987 | Lait | 333/26 |
| 5,528,074 | 6/1996 | Goto et al. | 333/26 X |
| 5,912,598 | 6/1999 | Stones et al. | 333/26 |

FOREIGN PATENT DOCUMENTS

| | | |
|---|---|---|
| 64-48502 | of 1989 | Japan . |
| 379104 | 8/1989 | Japan . |
| 2-37803 | 2/1990 | Japan . |
| 2-62103 | 3/1990 | Japan . |
| 5-259715 | 10/1993 | Japan . |
| 8-162810 | 6/1996 | Japan . |
| 8-274513 | 10/1996 | Japan . |

*Primary Examiner*—Paul Gensler
*Attorney, Agent, or Firm*—Ostrolenk, Faber, Gerb & Soffen, LLP

[57] ABSTRACT

A transducer is connected between a wave-guide tube and a microstrip line, has an antenna probe formed on a multi-layered insulating structure over the opening of the wave-guide tube and connected between the microstrip line and a ground plane, and an inter-level conductive pattern is formed around the zone over the opening so that the zone propagates electromagnetic wave between the wave-guide tube and the microstrip line without undesirable electromagnetic influences from a semiconductor bare chip mounted on the multi-layered insulating structure.

11 Claims, 6 Drawing Sheets

SMALL TRANSDUCER CONNECTED BETWEEN STRIP LINE AND WAVEGUIDE TUBE AND AVAILABLE FOR HYBRID INTEGRATED CIRCUIT

FIELD OF THE INVENTION

This invention relates to a transducer between a strip line and a wave-guide tube and, more particularly, to a small transducer available for a hybrid integrated circuit.

DESCRIPTION OF THE RELATED ART

Figure 1:
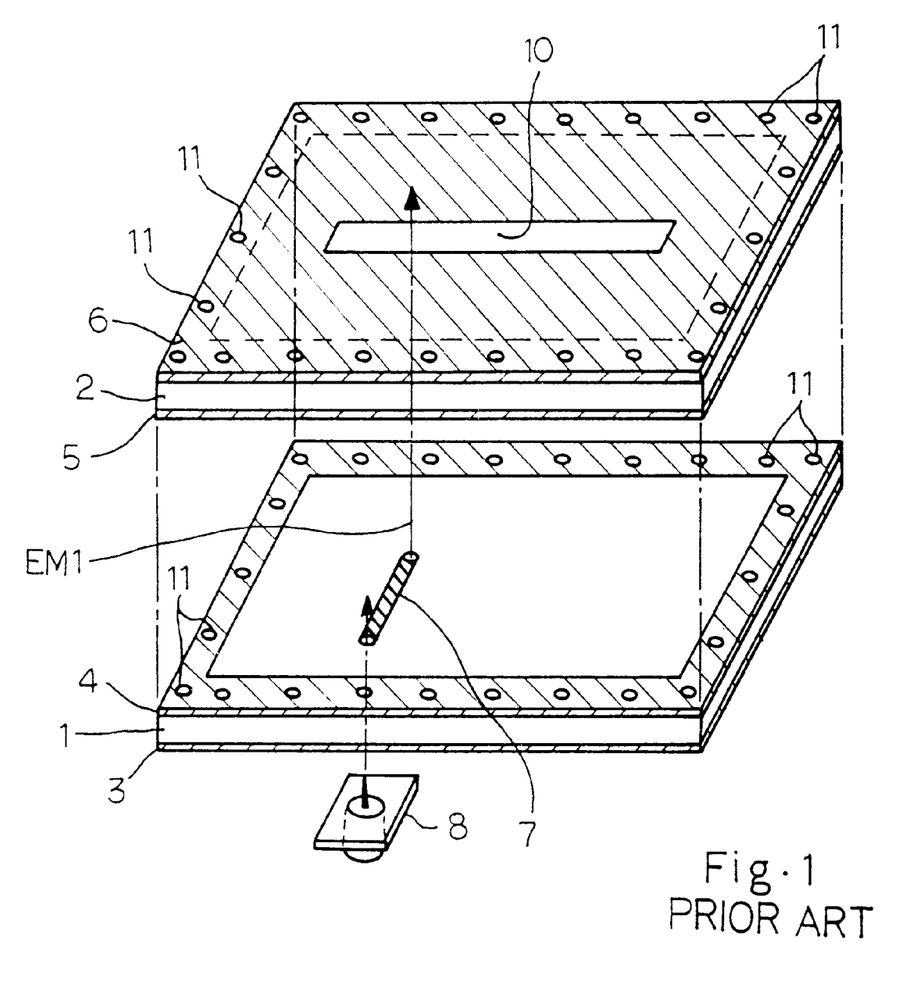
FIG. 1 is a fragmentary perspective view showing the prior art transducer.

A typical example of the transducer between a strip line and wave-guide tube is disclosed in Japanese Patent Publication of Unexamined Application No. 3-79104, and FIG. 1 illustrates the prior art transducer. The prior art transducer is implemented by a printed slot antenna, and comprises dielectric plates 1/2 respectively covered with copper films 3/4 and 5/6. The dielectric plates 1/2 and the copper films 3/4 and 5/6 form in combination multi-layered substrates. The copper films 3/4/5/6 are hatched for better understanding. Although the copper film 5 is laminated on the copper film 4, they are spaced so as to show the inner structure of the prior art transducer. A microstrip line 7 is supported by the dielectric plate 1, and a coaxial connector 8 is connected to the microstrip line 7. Electromagnetic wave is supplied from an external microwave device through the coaxial connector 8 to the microstrip line 7.

A slot 10 is formed in the copper film 6, and is electromagnetically excited by electromagnetic wave EM1 propagated through the microstrip line 7. Through-holes 11 are formed along the periphery of the multi-layered substrates, and the inner surfaces are plated with conductive films so as to short-circuit both surfaces. The multi-layered substrates are assembled into the prior art transducer. A wave-guide tube (not shown) is attached to the copper film 6, and the slot 10 is exposed to the inside of the wave-guide tube.

Electromagnetic wave is transferred between the coaxial cable 8 and the wave-guide tube as follows. The microstrip line 7 propagates the electromagnetic wave EM1 from one end connected to the coaxial connector 8 to the other end, and the electromagnetic wave EM1 excites the slot 10. Electromagnetic wave is radiated from the slot 10 to the wave-guide tube (not shown). On the other hand, when electromagnetic wave is supplied from the wave-guide tube (not shown) to the slot 10, electromagnetic wave is propagated through the microstrip line 7, and the microstrip line 7 supplies the electromagnetic wave to the coaxial connector 8.

The prior art transducer encounters a problem in that a circuit board is independently required for a semiconductor device. The two multi-layered substrates are incorporated in the prior art transducer. The slot 10 occupies most of the major surface of one of the two multi-layered substrates. Moreover, the electromagnetic wave is propagated between the microstrip line 7 and the external micro-device through the coaxial connector 8. Even if a semiconductor device is mounted on the other multi-layered substrate, there is not any suitable connecting means to connect the coaxial connector 8 to the semiconductor device. Thus, the prior art transducer is hardly used as a package for a hybrid integrated circuit.

SUMMARY OF THE INVENTION

It is therefore an important object of the present invention to provide a small thin transducer, which is available for a hybrid integrated circuit.

In accordance with one aspect of the present invention, there is provided a transducer connected between a wave-guide tube and a microstrip line and comprising an insulating structure having a first major surface and a second major surface having a first area exposed to an opening of the wave-guide tube, a plurality of vertical conductive members extending in a direction of the thickness of the insulating structure in such a manner as to surround a zone over the first area, an antenna probe supported by the insulating structure, having one end connected to the microstrip line and located within the zone for relaying an electromagnetic wave between the wave-guide and the microstrip line, a conductive pattern supported by the insulating structure, having a conductive path to a source of ground voltage and connected to the other end of the antenna probe and a conductive cap attached to the first major surface, and defining a space over at least a second area in the zone.

BRIEF DESCRIPTION OF THE DRAWINGS

The features and advantages of the transducer will be more clearly understood from the following description taken in conjunction with the accompanying drawings in which.

DESCRIPTION OF THE PREFERRED EMBODIMENTS

First Embodiment

Figure 2:
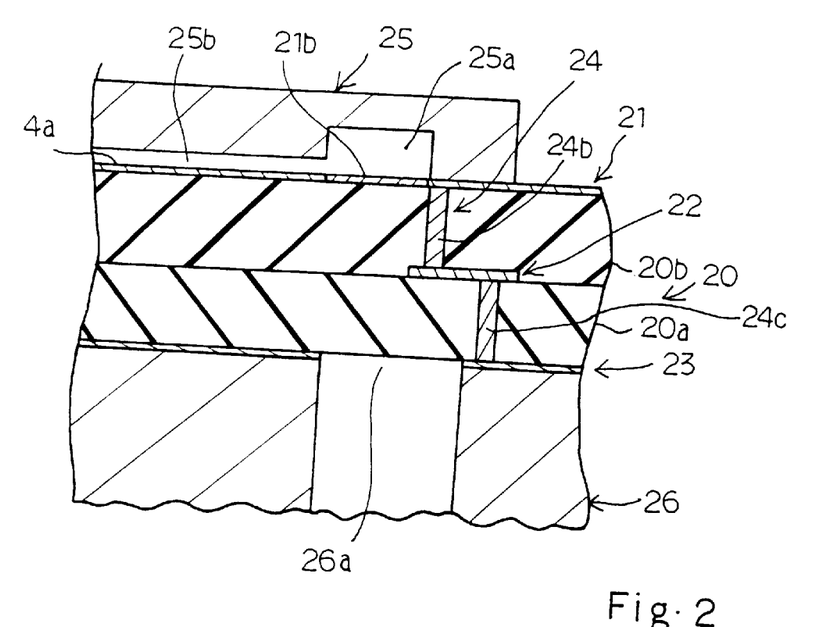
FIG. 2 is a cross sectional view showing an essential part of a transducer according to the present invention.
Figure 3:
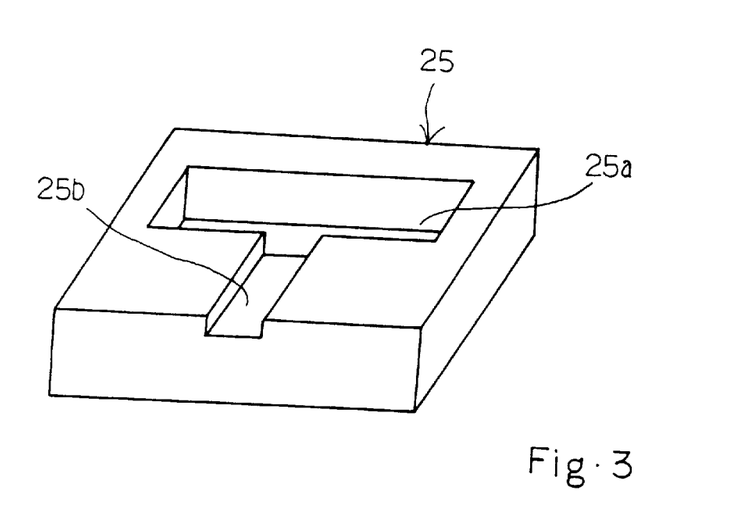
FIG. 3 is a perspective view showing a conductive cap incorporated in the transducer.

Referring to FIGS. 2 and 3 of the drawings, a transducer embodying the present invention largely comprises a multi-layered insulating structure 20, an upper conductive pattern 21, an inner conductive pattern 22, a lower conductive pattern 23, an inter-level conductive pattern 24 and a conductive cap 25. A wave-guide tube 26 is opposed to the lower surface of the multi-layered insulating structure 20, and is open to a predetermined area of the lower surface of the multi-layered insulating structure 20. The opening is designated by reference 26a.

The multi-layered insulating structure 20 includes a lower insulating layer 20a and an upper insulating layer 20b laminated on the lower insulating layer 20a. The upper conductive pattern 21 is formed on the upper surface of the upper insulating layer 20b, and the inner conductive pattern 22 and the lower conductive pattern 23 are formed on the upper surface and the lower surface of the lower insulating layer 20a. The inter-level conductive pattern 24 selectively connects the upper conductive pattern 21 to the inner conductive pattern 22 and the lower conductive pattern 23 and the inner conductive pattern 22 to the lower conductive pattern 23 as will be described hereinlater in detail. The conductive cap 25 has a deep recess 25a and a shallow recess 25b, and the deep recess 25a and the shallow recess 25b are arranged in T-letter shape.

Figure 4:
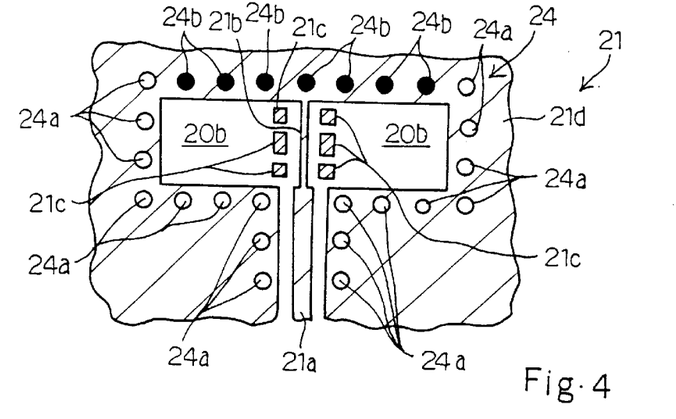
FIG. 4 is a plane view showing the uppermost pattern incorporated in the transducer.

The upper conductive pattern 21 is illustrated in FIG. 4, and is indicated by hatching lines. The upper conductive pattern 21 has a microstrip line 21a, an antenna probe 21b narrower than the microstrip line 21a, a frequency regulating sub-pattern 21c formed on both sides of the antenna probe 21b and a remaining sub-pattern 21d. The antenna probe 21b is grounded, and, accordingly, the microstrip line 21a is connected through the antenna probe 21b to the ground.

The antenna probe 21b receives an electromagnetic wave propagated through the wave-guide tube 26, and the frequency regulating sub-pattern 21c regulates frequency conversion between the electromagnetic wave propagated through the wave-guide 26 and the electromagnetic wave propagated through the microstrip line 21a.

The micro-strip conductive line 21a and an area over the opening 26a are covered with the conductive cap 25. The area over the opening 26a is opposed to the deep recess 25a, and the microstrip line 21a is opposed to the shallow recess 25b. Thus, the conductive cap 25 electromagnetically shields a transmission line containing the wave-guide tube 26 and the microstrip line 21a along the periphery thereof.

The inter-level conductive pattern 24 includes long vertical interconnections 24a, short vertical interconnections 24b/24c. The short vertical interconnections 24c will be described hereinlater in connection with the inner conductive pattern 22. The inter-level conductive pattern 24 shields the microstrip line 21a, the antenna probe 21b and a zone of the multi-layered insulating structure 20 over the opening 26a from electromagnetic influence therearound.

The long vertical interconnections 24a penetrate the upper insulating layer 20b and the lower insulating layer 20a, and are exposed to the upper surface of the upper insulating layer 20b and the lower surface of the lower insulating layer 20a. On the other hand, the short vertical interconnections 24b penetrate only the upper insulating layer 20b, and are exposed to both upper and lower surfaces of the upper insulating layer 20b. Both long and short interconnections 24a/24b are held in contact with a ground plane incorporated in the upper conductive pattern 21. The locations of the long vertical interconnections 24a and the locations of the short vertical interconnections 24b are indicated by bubbles and dots, respectively, in FIGS. 4 and 5 and are labeled with the same references as the long vertical interconnections 24a and the short vertical interconnections 24b.

Figure 5:
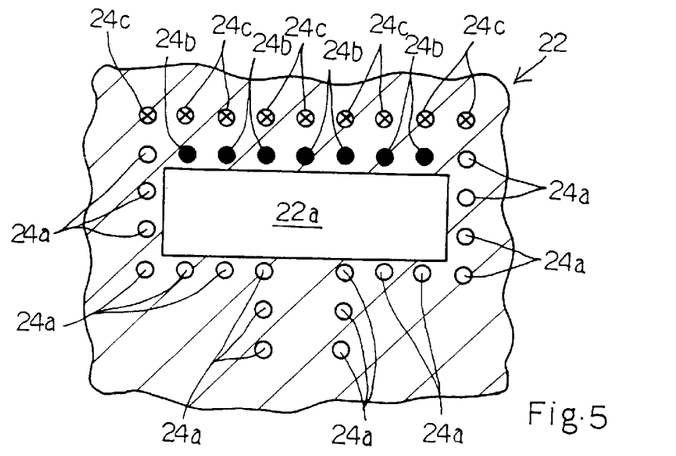
FIG. 5 is a plane view showing the middle-level pattern incorporated in the transducer.

The inner conductive pattern 22 is also hatched in FIG. 5, and is partially removed from an area of the upper surface of the lower insulating layer 20a over the opening 26a. The long vertical interconnections 24a pass through the inner conductive pattern 22, and are electrically connected to a ground plane incorporated in the inner conductive pattern 22. The short vertical interconnections 24b are terminated at the ground plane of the inner conductive pattern 22.

The short vertical interconnections 24c are provided between the inner conductive pattern 22 and the lower conductive pattern 23, and the upper ends of the short vertical interconnections 24c are held in contact with the ground plane of the inner conductive pattern 22. The locations of the short vertical interconnections 24c are indicated by mark "x" in a small circle, and are labeled with the same references as the short vertical interconnections 24c.

Figure 6:
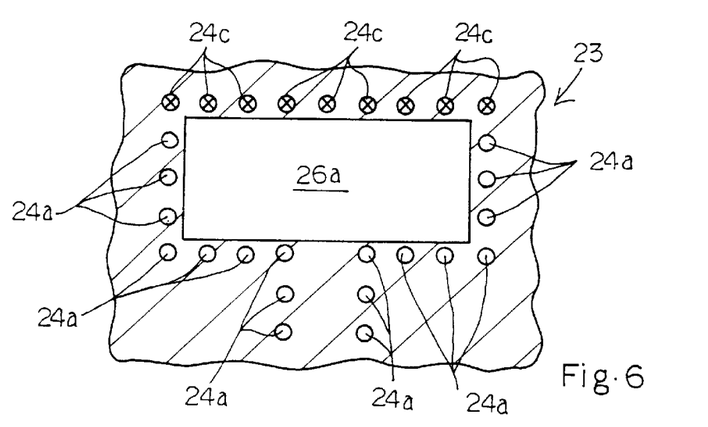
FIG. 6 is a plane view showing the lowermost pattern incorporated in the transducer.

The lower conductive pattern 23 is also hatched in FIG. 6, and is partially removed from the predetermined area of the lower surface of the lower insulating layer 20a exposed to the opening 26a. The short vertical interconnections 24c are terminated at a ground plane incorporated in the lower conductive pattern 23. Thus, the microstrip line 21a, the antenna probe 21b and the zone over the opening 26a are surrounded by the inter-level conductive pattern 24, and are electrically shielded from electromagnetic influences. For this reason, the electromagnetic wave is propagated through the zone of the multi-layered insulating structure 20 without undesirable electromagnetic influences, and is transferred through the antenna probe 21b between the wave-guide tube 26 and the microstrip line 21a.

Figure 7:
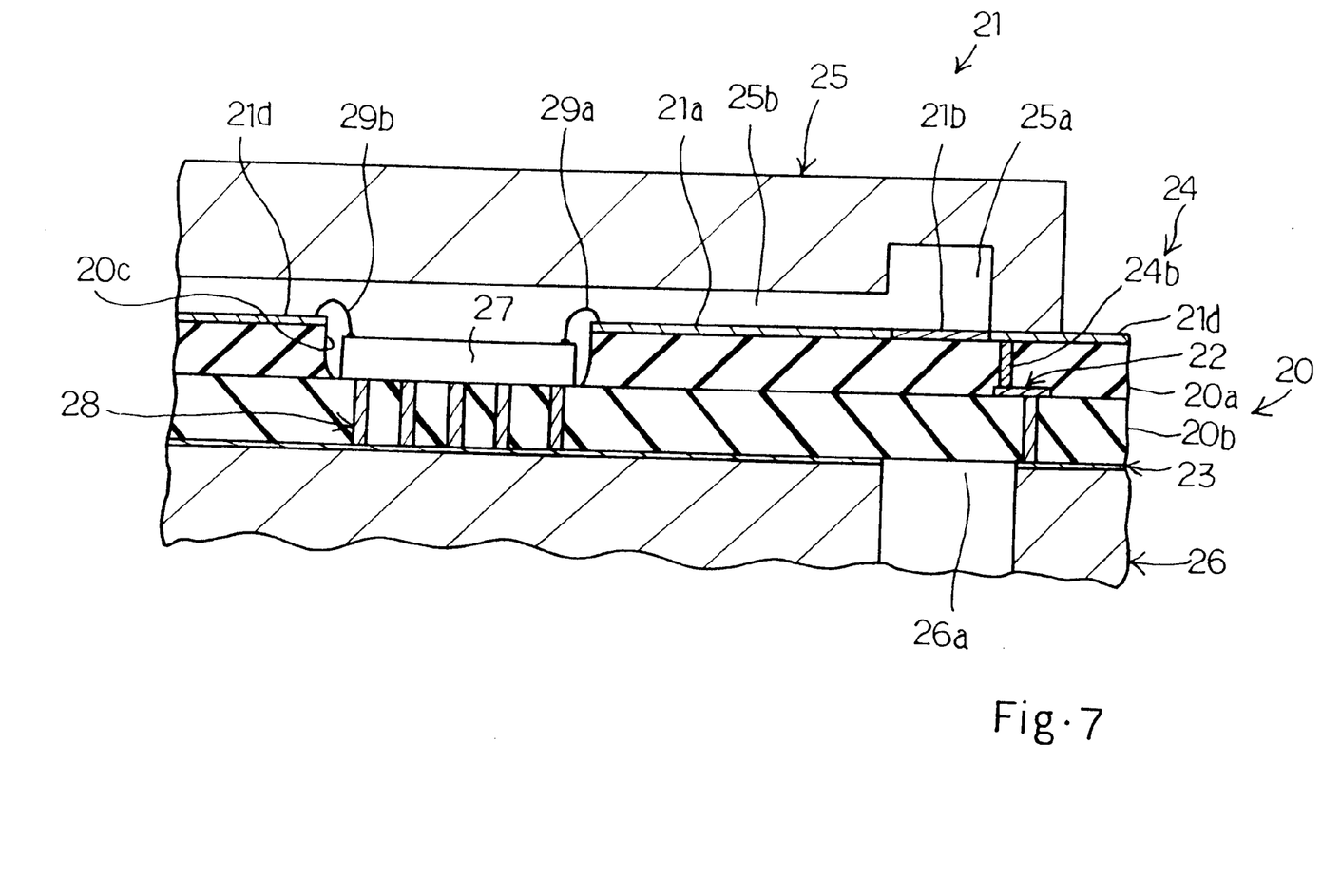
FIG. 7 is a cross sectional view showing a semiconductor device mounted on the transducer.

The transducer according to the present invention is used as a package for a semiconductor bare chip 27 as shown in FIG. 7. An integrated circuit may be fabricated on the semiconductor bare chip 27. The upper insulating layer 20b is partially removed from the multi-layered insulating structure 20, and a recess 20c is formed in the multi-layered insulating structure 20. Through-holes are formed in the lower insulating layer 20a, and are exposed to the bottom surface of the recess 20c. Vertical interconnections 28 pass the through-holes, and are held in contact with the lower conductive pattern 23. The semiconductor bare chip 27 is received in the recess 20c, and the integrated circuit is connected through the vertical interconnections 28 to the lower conductive pattern 23 and through conductive wires 29a/29b to the upper conductive pattern 21. Although electromagnetic noise is radiated from the semiconductor bare chip 27, the inter-level conductive pattern 24 prevents the zone over the opening 26a and the microstrip line 21a from the electromagnetic noise.

As will be understood from the foregoing description, the probe antenna 21b is patterned on the multi-layered insulating structure 20 over the opening 26a of the wave-guide tube 26, and the inter-level conductive pattern surrounds the microstrip line 21a, the antenna probe 21b and the zone over the opening 26a. The electromagnetic wave is transferred between the wave-guide tube 26 and the microstrip line 21a without electromagnetic influences. The semiconductor bare chip can be mounted on the multi-layered insulating structure 20, and the total volume is reduced as compared to the prior art. Moreover, the upper conductive pattern 21 is directly connected to the semiconductor bare chip 27, and no coaxial connector is required. Thus, the transducer according to the present invention is small and available for a hybrid integrated circuit.

Second Embodiment

Figure 8:
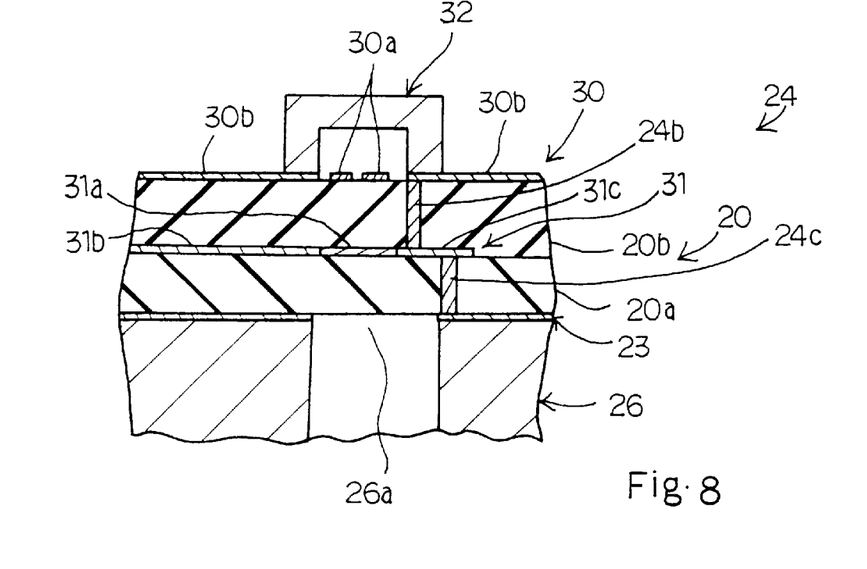
FIG. 8 is a cross sectional view showing the structure of another transducer according to the present invention.

FIG. 8 illustrates another transducer embodying the present invention. The transducer embodying the present invention is similar to the first embodiment except for an upper conductive pattern 30, an inner conductive pattern 31 and a conductive cap 32. For this reason, the other layers are labeled with the same references designating corresponding layers of the first embodiment without detailed description.

Figure 9:
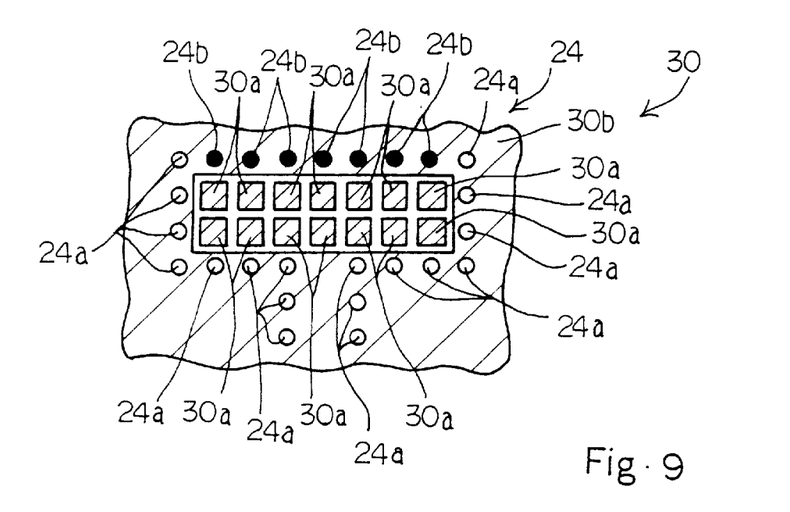
FIG. 9 is a plane view showing an upper conductive pattern incorporated in the transducer shown in FIG. 8.

An antenna probe 31a and a microstrip line 31b form the inner conductive pattern 31 together with another conductive sub-pattern 31c. For this reason, a frequency regulating sub-pattern 30a is incorporated in the upper conductive pattern 30 together with another conductive sub-pattern 30b as shown in FIG. 9. The conductive cap 32 is expected to shield the zone of the multi-layered insulating structure 20 over the opening 26a, because the upper insulating layer 20b shields the microstrip line 31b. For this reason, the conductive cap 32 is smaller than the conductive cap 25. Though not shown in FIG. 8, a semiconductor bare chip is mounted on the multi-layered insulating structure 20, and the transducer implementing the second embodiment achieves all the advantages of the first embodiment.

Third Embodiment

Figure 10:
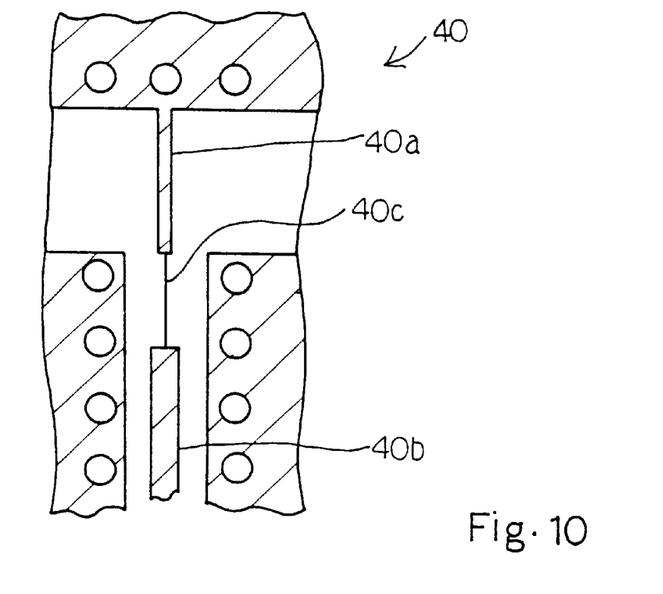
FIG. 10 is a plane view showing an upper conductive pattern incorporated in yet another transducer according to the present invention.

FIG. 10 illustrates yet another upper conductive pattern 40 embodying the present invention. The other layers and structures are similar to those of the first embodiment, and no further description is incorporated hereinbelow.

The upper conductive pattern 40 includes an antenna probe 40a, a microstrip line 40b and a high impedance transformer 40c. The high impedance transformer 40c achieves the impedance matching between the wave-guide tube and the microstrip line 40b at a predetermined frequency range.

The impedance of the wave-guide tube is of the order of 370 ohms, and the impedance of the microstrip line 40b is of the order to 50 ohms. If the wave-guide tube is directly connected through the antenna probe 40a to the microstrip line 40b, the transducer suffers from large loss due to the impedance mis-matching. For this reason, the high impedance transformer is provided between the antenna probe 40a and the microstrip line 40b.

Fourth Embodiment

Figure 11:
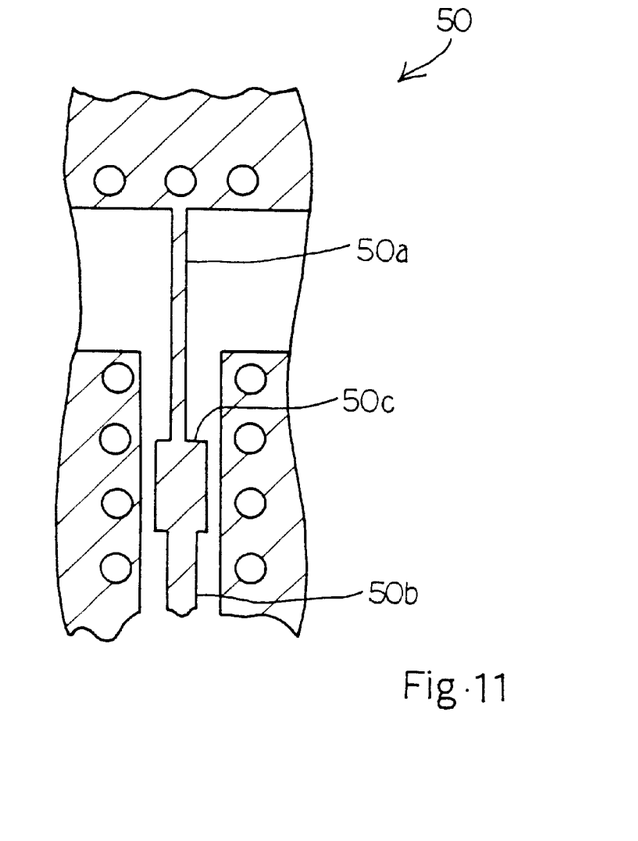
FIG. 11 is a plane view showing an upper conductive pattern incorporated in yet another transducer according to the present invention.

FIG. 11 illustrates still another upper conductive pattern 50 embodying the present invention. The other layers and structures are similar to those of the first embodiment, and no further description is incorporated hereinbelow.

The upper conductive pattern 50 includes an antenna probe 50a, a microstrip line 50b and a low impedance transformer 50c. The low impedance transformer 50c achieves the impedance matching between the wave-guide tube and the microstrip line 50b at a predetermined frequency range different from that of the third embodiment. The low impedance transformer 50c reduces the loss at the frequency range.

As will be appreciated from the foregoing description, the electromagnetic wave is propagated through the zone of the multi-layered insulating structure electromagnetically shield by the inter-level conductive pattern, and the propagation path makes the transducer according to the present invention small. The inter-level conductive pattern shields not only the zone but also the microstrip line and the antenna probe from electromagnetic influences, and the manufacturer can use the multi-layered insulating structure as a package for a semiconductor chip. In other words, the semiconductor chip is hermetically sealed in the multi-layered insulating structure and the conductive cap.

Although particular embodiments of the present invention have been shown and described, it will be obvious to those skilled in the art that various changes and modifications may be made without departing from the spirit and scope of the present invention.

For example, the frequency regulating sub-pattern may not be incorporated in the transducer according to the present invention. The multi-layered insulating structure may include more than two insulating layers so as to add another inner conductive pattern.

More than one semiconductor chip or device may be mounted on or in the multi-layered insulating structure.

Different insulating material may form the insulating layers of the multi-layered insulating structure. The multi-layered insulating structure may vary the thickness. The vertical interconnections may be arranged into a step configuration. An insulating substrate is available for the transducer according to the present invention. Finally, the inter-level conductive pattern may twice surround the microstrip line, the antenna probe and the zone.

The inter-level conductive pattern may be implemented by tubular conductive lines.

What is claimed is:

1. A transducer connected between a wave-guide tube and a microstrip line, comprising:

an insulating structure having a first major surface and a second major surface having a first area exposed to an opening of said wave-guide tube;

a plurality of vertical conductive members extending in a direction of the thickness of said insulating structure in such a manner as to surround a zone over said first area;

p1 an antenna probe supported by said insulating structure, having one end connected to said microstrip line, and located within said zone for relaying an electromagnetic wave between said wave-guide and said microstrip line;

a conductive pattern supported by said insulating structure, having a conductive path to a source of ground voltage, and connected to the other end of said antenna probe; and a conductive cap attached to said first major surface, and defining a space over at least a second area in said zone.

2. The transducer as set forth in claim 1, further comprising a frequency regulating sub-pattern supported by said insulating structure and located within said zone for regulating a frequency conversion between said wave-guide tube and said microstrip line.

3. The transducer as set forth in claim 2, in which said insulating structure has a plurality of insulating layers selectively penetrated by said plurality of vertical conductive members, and one of said plurality of insulating layers provides said first major surface having said second area where said antenna probe and said frequency regulating sub-pattern are formed.

4. The transducer as set forth in claim 3, in which said space is elongated over said microstrip line extending on said first major surface.

5. The transducer as set forth in claim 4, in which said one of said plurality of insulating layers is partially removed so as to form a recess outside of said zone, and a semiconductor chip is received in said recess.

6. The transducer as set forth in claim 5, in which said semiconductor chip is electrically connected to said microstrip line.

7. The transducer as set forth in claim 3, in which said conductive pattern has a first conductive sub-pattern formed on said first major surface and providing a first conductive sub-path to said source of ground voltage, a second conductive sub-pattern formed on a boundary surface between said plurality of insulating layers and providing a second conductive sub-path to said source of ground voltage and a third conductive sub-pattern formed on said second major surface and providing a third conductive sub-path to said source of ground voltage, and said plurality of vertical conductive members are selectively connected to said first conductive sub-path, said second conductive sub-path and said third conductive sub-path.

8. The transducer as set forth in claim 2, in which said insulating structure has a first insulating layer providing said second major surface and a second insulating layer laminated on said first insulating layer and providing said first major surface having said second area for forming said frequency regulating sub-pattern, and said antenna probe is formed on a boundary surface between said first insulating layer and said second insulating layer in such a manner as to be located over said opening.

9. The transducer as set forth in claim 8, in which said microstrip line extends on said boundary surface.

10. The transducer as set forth in claim 1, further comprising an impedance transformer connected between said antenna probe and said microstrip line and located within said zone.

11. The transducer as set forth in claim 10, in which said antenna probe, said impedance transformer and said microstrip line are formed on said first major surface.

* * * * *